(12) United States Patent
Park

(10) Patent No.: US 7,242,254 B2
(45) Date of Patent: Jul. 10, 2007

(54) ADJUSTABLE LOCK-IN CIRCUIT FOR PHASE-LOCKED LOOPS

(75) Inventor: Sangbeom Park, Tracy, CA (US)

(73) Assignee: ANA Semiconductor, Tracy, CA (US)

( * ) Notice: Subject to any disclaimer, the term of this patent is extended or adjusted under 35 U.S.C. 154(b) by 76 days.

(21) Appl. No.: 11/102,021

(22) Filed: Apr. 8, 2005

(65) Prior Publication Data

US 2006/0226915 A1 Oct. 12, 2006

(51) Int. Cl.
    *H03L 7/00* (2006.01)
(52) U.S. Cl. .................. 331/16; 331/17; 331/DIG. 2
(58) Field of Classification Search .............. 331/17, 331/57, DIG. 2, 16
    See application file for complete search history.

(56) References Cited

U.S. PATENT DOCUMENTS 6,229,403 B1 * 5/2001 Sekimoto ............... 331/57

2003/0214361 A1 * 11/2003 Nishikido ............... 331/57
2005/0046497 A1 * 3/2005 Nakanishi ............... 331/57

* cited by examiner

*Primary Examiner*—Robert Pascal
*Assistant Examiner*—Levi Gannon

(57) ABSTRACT

The adjustable lock-in circuits basically include a sensor, a reference voltage, two stacked PMOS transistors, two stacked NMOS transistors, and a feedback line. The sensor compares a feedback voltage with a reference voltage. If the sensing voltage does not reach the reference voltage, the output voltage of the sensor turns on the corresponding transistor, which provides a current to its output until the voltage at feedback reaches the reference voltage. The time to reach the expected voltage level is simply equal to the charge stored at the filter divided by the current, which can be scaled by a device aspect ratio of the transistor. Consequently, all adjustable lock-in circuits provide an adjustable initial loop condition closer to the expected loop condition according to a targeted lock-in time. In addition, the initial loop condition is varied by changing the reference voltage level.

19 Claims, 7 Drawing Sheets

ADJUSTABLE LOCK-IN CIRCUIT FOR PHASE-LOCKED LOOPS

FIELD OF THE INVENTION

The present invention relates to the field of fast-locking phase-locked loops and more particularly to adjustable lock-in circuit for phase-locked loops.

BACKGROUND ART

Phase-looked loop is a vitally important device. Phase-looked loop is analog and mixed signal building block used extensively in communication, networks, digital systems, consumer electronics, computers, and any other fields that require frequency synthesizing, clock recovery, and synchronization.

Prior Art FIG. 1 illustrates a block diagram of a basic architecture of two types of conventional phase-locked loops, which are a conventional phase-locked loop 110 and a conventional fast-locking phase-locked loop 120. The conventional phase-locked loop 110 typically consists of a phase-frequency detector (or phase detector), a charge-pump, a low-pass filter, and a voltage-controlled oscillator in a loop. Phase-locked loops without any frequency divider in a loop are considered here for simplicity. The phase-frequency detector (or phase detector) is a block that has an output voltage with an average value proportional to the phase difference between the input signal and the output signal of the voltage-controlled oscillator. The charge-pump either injects the charge into the low-pass filter or subtracts the charge from the low-pass filter, depending on the outputs of the phase-frequency detector (or phase detector). Therefore, change in the low-pass filter's output voltage drives the voltage-controlled oscillator. The negative feedback of the loop results in the output of the voltage-controlled oscillator being synchronized with the input signal. As a result, the phase-locked loop is in lock.

In the conventional phase-locked loop 110 of Prior Art FIG. 1, lock-in time is defined as the time that is required to attain lock from an initial loop condition. Assuming that the phase-locked loop bandwidth is fixed, the lock-in time is proportional to the difference between the input signal frequency and the initial voltage-controlled oscillator's frequency as follows:

$$\frac{(\omega_{in} - \omega_{osc})^2}{\omega_0^3}$$

where $\omega_{in}$ is the input signal frequency, $\omega_{osc}$ is the initial voltage-controlled oscillator's frequency, and $\omega_0$ is the loop bandwidth. The loop bandwidth must be wide enough to obtain a fast lock-in time. But most systems require a fast lock-in time without regard to the input signal frequency, bandwidth, and output phase jitter due to external noise. However, the conventional phase-locked loop 110 shown in Prior Art FIG. 1 has suffered from slow locking and harmonic locking. Thus, time and power are unnecessarily consumed until the phase-locked loops become locked. In addition, it has taken a vast amount of time to simulate and verify the conventional phase-locked loop 110 before fabrication since the simulation time of phase-locked loop circuits is absolutely proportional to time that is required the phase-locked loops to be locked. This long simulation adds additional cost and serious bottleneck to better design time to market. For these reasons, the conventional phase-locked loop 110 of Prior Art FIG. 1 is very inefficient to implement in an integrated circuit (IC) or system-on-chip (SOC).

To overcome the drawbacks of the conventional phase-locked loop 110 of Prior Art FIG. 1, a conventional fast-locking phase-locked loop 120 of Prior Art FIG. 1 is illustrated. The conventional fast-locking phase-locked loop 120 consists of a digital phase-frequency detector, a proportional-integral controller 122, a 10-bit digital-to-analog converter 124, and a voltage-controlled oscillator. Unfortunately, the conventional fast-locking phase-locked loop is costly, complicated, and inefficient to implement in system-on-chip (SOC) or integrated circuit (IC) because additional proportional-integral controller 122 and the 10-bit digital-to-analog converter 124 take much more chip area, consume much more power, and make the stability analysis very difficult. The complexity increases the number of blocks that need to be designed and verified. The conventional fast-locking phase-locked loop 120 might improve the lock-in time, but definitely results in bad time-to-market, higher cost, larger chip area, much more power consumption, and longer design time.

Thus, what is desperately needed is a highly cost-effective fast-locking phase-locked loop that can be highly efficiently implemented with a drastic improvement in a very fast lock-in time, lock-in time controllability, adjustable initial condition, performance, cost, chip area, power consumption, stand-by time, and fast design time for much better time-to-market. At the same time, serious harmonic locking problem has to be resolved. The present invention satisfies these needs by providing adjustable lock-in circuits.

SUMMARY OF THE INVENTION

The present invention provides five types of the adjustable lock-in circuits for phase-locked loops. The adjustable lock-in circuits simultaneously enable any phase-locked loop to be locked according to a targeted lock-in time. In addition, the output voltage level is varied by changing the reference voltage level. The basic architecture of the adjustable lock-in circuits consists of a sensor, a reference voltage, two stacked PMOS transistors, two stacked NMOS transistors, and a feedback line. The sensor compares a feedback voltage with a reference voltage. If the sensing voltage does not reach the reference voltage, the output voltage of the sensor turns on the corresponding transistor, which provides a current to its output until the output voltage reaches the reference voltage. The time to reach the expected voltage level is simply equal to the charge stored at the filter divided by the current, which can be scaled.

Consequently, all adjustable lock-in circuits provide a significant reduction in the difference between the initial loop condition and the locked condition in order to overcome serious drawbacks simultaneously. The lock-in time controllability enables all of the phase-locked loops on the chip to be locked according to schedule. In addition, the present invention has five different embodiments which achieve a drastic improvement in a very fast lock-in time, lock-in time controllability, adjustable initial condition, performance, cost, chip area, power consumption, stand-by time, and design time.

BRIEF DESCRIPTION OF THE DRAWINGS

The accompanying drawings, which are incorporated in and form a part of this specification, illustrate five embodiments of the invention and, together with the description, serve to explain the principles of the invention.

Prior Art

DESCRIPTION OF THE PREFERRED EMBODIMENTS

In the following detailed description of the present invention, five types of the adjustable lock-in circuits, numerous specific details are set forth in order to provide a thorough understanding of the present invention. However, it will be obvious to one skilled in the art that the present invention may be practiced without these specific details. In other instances, well known methods, procedures, CMOS digital gates, components, and metal-oxide-semiconductor field-effect transistor (MOSFET) device physics have not been described in detail so as not to unnecessarily obscure aspects of the present invention.

Figure 1:
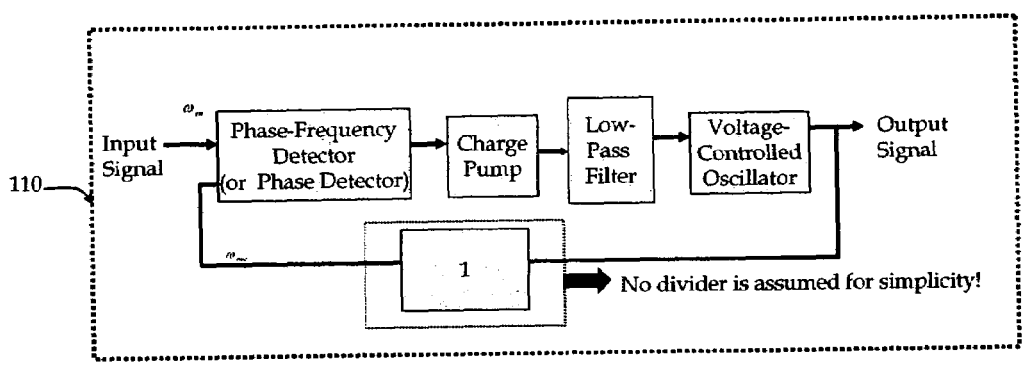
FIG. 1 illustrates a block diagram of two types of conventional phase-locked loops.
Figure 1:
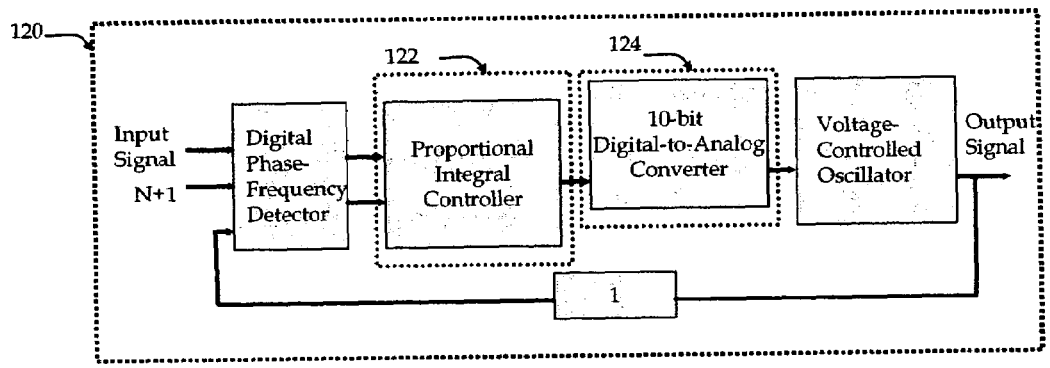
Figure 2:
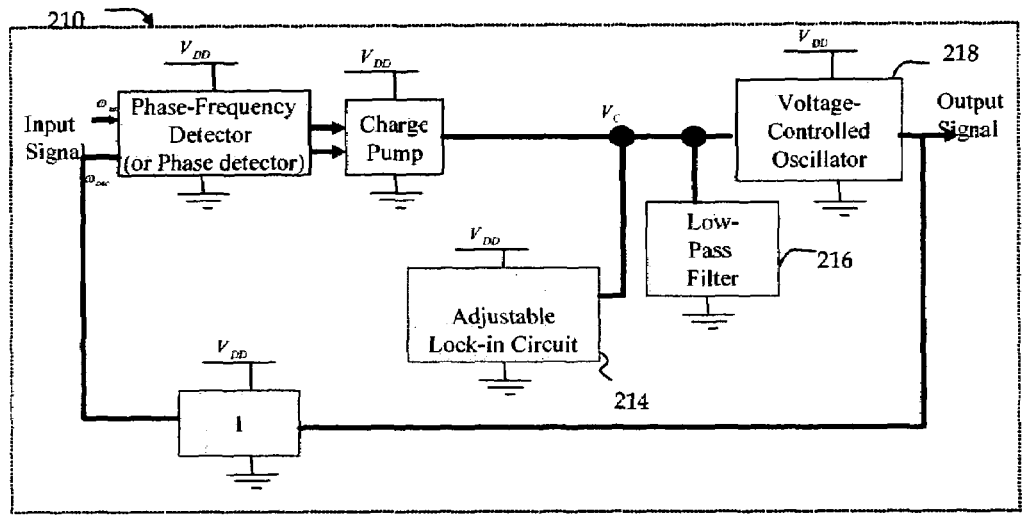
FIG. 2 illustrates a block diagram of two types of adjustable lock-in circuits for phase-locked loops in accordance with the present invention.
Figure 2:
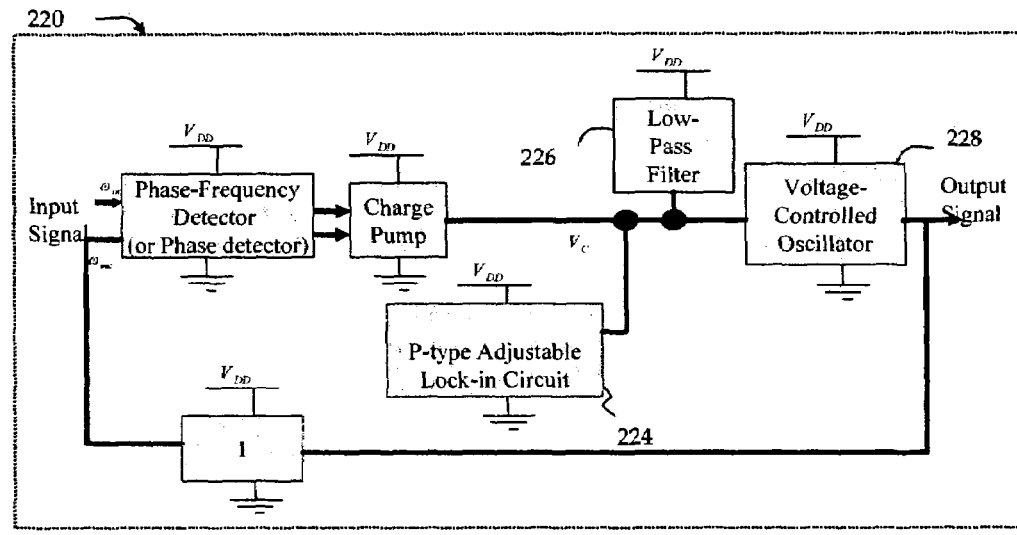

FIG. 2 illustrates a block diagram of two types of the adjustable lock-in circuits for phase-locked loops in accordance with the present invention. One type of the adjustable lock-in circuit is applied for phase-locked loops including a filter 216 connected between $V_C$ and ground, as seen in the phase-locked loop 210 shown in FIG. 2. The other type of the adjustable lock-in circuit called "p-type adjustable lock-in circuit" is applied for phase-locked loops including a filter 226 connected between $V_{DD}$ and $V_C$, as seen in the phase-locked loop 220 shown in FIG. 2. To reduce the difference between the initial loop condition and the locked condition, the outputs of the adjustable lock-in circuit 214 and the p-type adjustable lock-in circuit 224 are coupled to the outputs of the filter 216 and the filter 226, respectively, as shown in FIG. 2. The phase-locked loop 210 excluding the adjustable lock-in circuit 214 represents all types of phase-locked loops including a filter 216 connected between $V_C$ and ground without regard to the types of phase-locked loops because the applications of the adjustable lock-in circuit 214 are independent of architectures and types of phase-locked loops. The phase-locked loop 220 excluding the p-type adjustable lock-in circuit 224 represents all types of phase-locked loops including a filter 226 connected between $V_{DD}$ and $V_C$ without regard to the types of phase-locked loops because the applications of the p-type adjustable lock-in circuit 224 are independent of architectures and types of phase-locked loops. The filters 216 and 226 are low-pass filters. If these filters are multiple-order low-pass filters, then they will be approximated to the first-order filter with neglecting resistor in the filter for simplicity.

Figure 3:
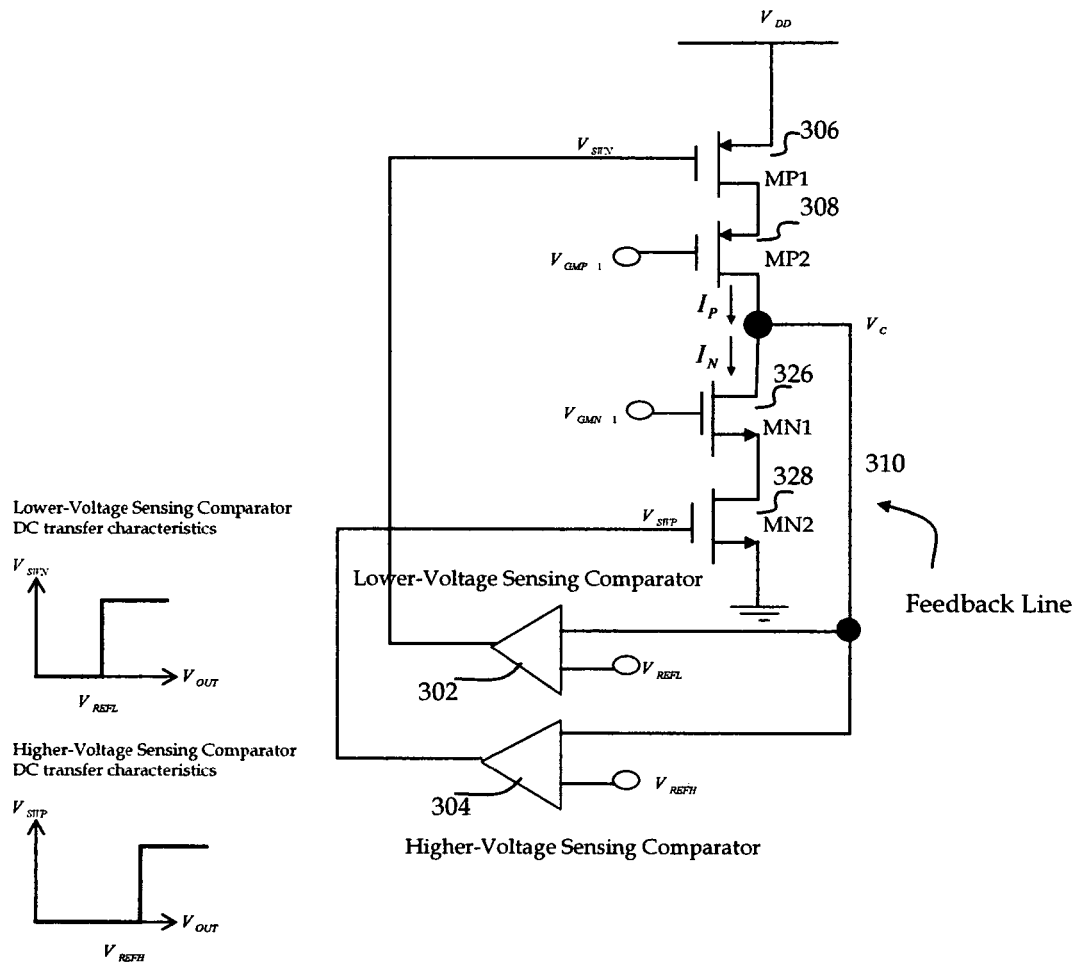
FIG. 3 illustrates a circuit diagram of a basic adjustable lock-in circuit according to the present invention.

FIG. 3 illustrates a basic adjustable lock-in circuit according to the present invention. This basic adjustable lock-in circuit 300 does not have power-down mode in order to show the fundamental concept of the invention clearly. The basic adjustable lock-in circuit 300 is a feedback circuit that consists of a lower-voltage sensing comparator 302, a higher-voltage sensing comparator 304, two reference voltages, two stacked PMOS transistors 306 and 308, two stacked NMOS transistors 326 and 328, and a feedback line 310. The gate terminal of a PMOS transistor 308 is connected to a proper fixed-bias voltage (not shown) or ground (e.g., "0", low, etc.). The gate terminal of a NMOS transistor 326 is connected to a proper fixed-bias voltage (not shown) or power supply voltage (e.g., $V_{DD}$, "1", high, etc.).

It is assumed that the output of the basic adjustable lock-in circuit 300 is at ground. Since the lower-voltage sensing comparator 302 initially senses a voltage less than the lower reference voltage, the output voltage of the lower-voltage sensing comparator 302 is low enough to turn on the PMOS transistor 306. At the same time, the output voltage of the higher-voltage sensing comparator 304 is low enough to turn off the NMOS transistor 328. Thus, the PMOS transistor 306 provides a current (i.e., $I_p$) to the output until the output voltage (i.e., $V_C$) goes up to the lower reference voltage. The time to reach the expected voltage level at the filter connected between $V_C$ and ground is as follows:

$$\Delta t = \frac{V_{REFL} C_P}{I_P}$$

where $V_{REFL}$ is the lower reference voltage and $C_P$ is the value of the capacitor in the filter. Thus, the lock-in time of the phase-locked loops including the filter connected between $V_C$ and ground is approximately given by $$\frac{(\omega_{in} - \omega_{REFL})^2}{\omega_0^3} + \frac{V_{REFL} C_P}{I_P}$$

where $\omega_{in}$ is the input signal frequency, $\omega_{REFL}$ is the voltage-controlled oscillator's frequency for $V_C = V_{REFL}$, and $\omega_0$ is the loop bandwidth. This lock-in time is varied by the current $I_P$ depending on the size of the PMOS transistor 306.

Now it is differently assumed that the output of the basic adjustable lock-in circuit 300 is at power supply. Since the higher-voltage sensing comparator 304 initially senses a voltage greater than the higher reference voltage, the output voltage of the higher-voltage sensing comparator 304 is high enough to turn on the NMOS transistor 328. At the same time, the output voltage of the lower-voltage sensing comparator 302 is high enough to turn off the PMOS transistor 306. Thus, the NMOS transistor 328 provides a current (i.e., $I_N$) to the output until the output voltage (i.e., $V_C$) goes down to the higher reference voltage. The time to reach the expected voltage level at the filter connected between $V_C$ and power supply is as follows:

$$\Delta t = \frac{(V_{DD} - V_{REFH}) C_P}{I_N}$$

where $V_{REFH}$ is the higher reference voltage and $C_P$ is the value of the capacitor in the filter. Thus, the lock-in time of the phase-locked loops including the filter connected between $V_C$ and power supply is approximately given by $$\frac{(\omega_{in} - \omega_{REFH})^2}{\omega_0^3} + \frac{(V_{DD} - V_{REFH})C_P}{I_N}$$

where $\omega_{in}$ is the input signal frequency, $\omega_{REFH}$ is the voltage-controlled oscillator's frequency for $V_C = V_{REFH}$, and $\omega_0$ is the loop bandwidth. This lock-in time is varied by the current $I_N$ depending on the size of the NMOS transistor 328.

In design of the basic adjustable lock-in circuit of FIG. 3, it is also desirable to use a value for the lower reference voltage, $V_{REFL}$, less than $V'_C$ and a value for the higher reference voltage, $V_{REFH}$, greater than $V'_C$. $V'_C$ is the voltage that makes the frequency of the voltage-controlled oscillator equal to the input signal's frequency.

Figure 4:
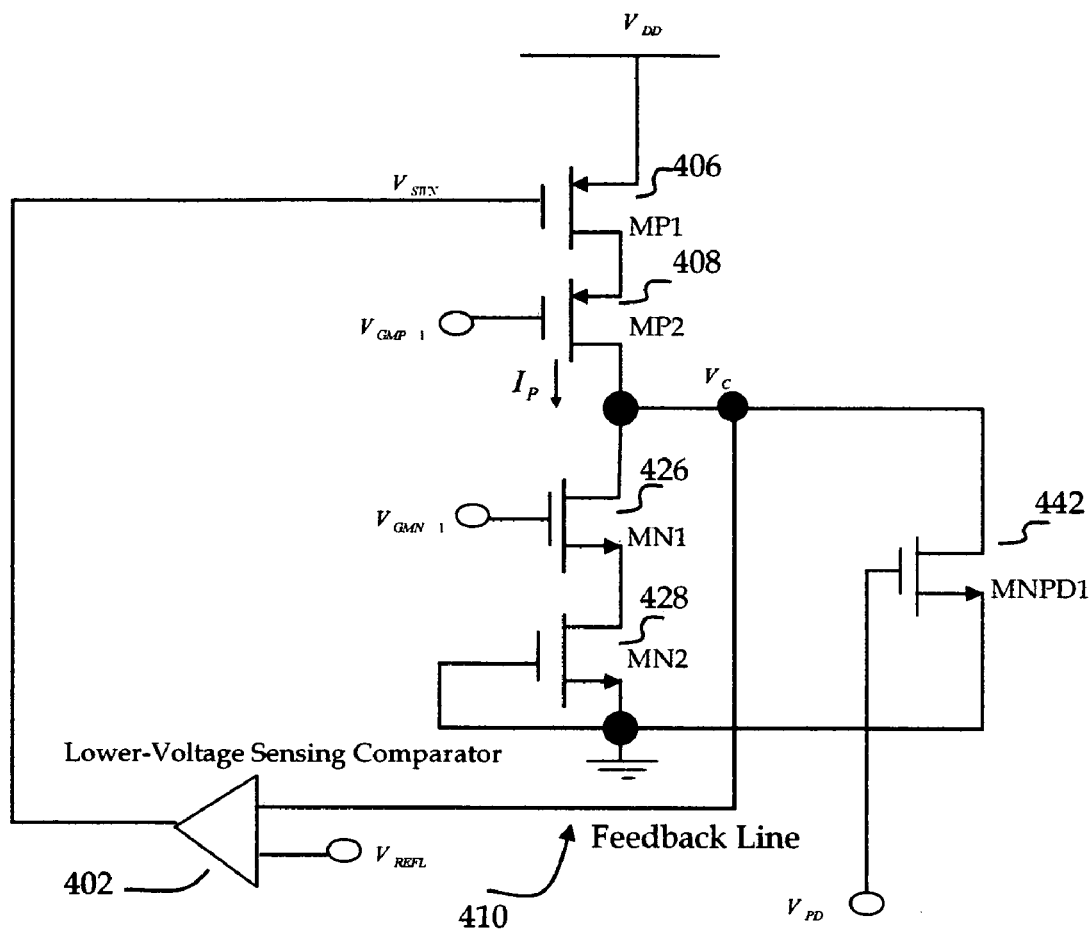
FIG. 4 illustrates a circuit diagram of an adjustable lock-in circuit in accordance with the present invention.

FIG. 4 illustrates an adjustable lock-in circuit 400 according to the present invention. A power-down input voltage, $V_{PD}$, is defined as the input voltage for power-down mode. The power-down enable system is in power-down mode when $V_{PD}$ is $V_{DD}$ and it is in normal mode when $V_{PD}$ is zero. The adjustable lock-in circuit 400 is a feedback circuit that consists of a lower-voltage sensing comparator 402, a reference voltage, two stacked PMOS transistors 406 and 408, two stacked NMOS transistors 426 and 428, a feedback line 410, and a power-down NMOS transistor 442. In addition, the gate terminal of a PMOS transistor 408 is connected to a proper fixed-bias voltage (not shown) or ground (e.g., "0", low, etc.). The gate terminal of a NMOS transistor 426 is connected to a proper fixed-bias voltage (not shown) or power supply voltage (e.g., $V_{DD}$, "1", high, etc.). Furthermore, the gate terminal of a NMOS transistor 428 is shorted and thus no current flows into the drains of the NMOS transistors 426 and 428.

The circuit mode changes from power-down mode to normal mode in FIG. 4. Since the lower-voltage sensing comparator 402 initially senses a voltage less than the lower reference voltage, the output voltage of the lower-voltage sensing comparator 402 is low enough to turn on the PMOS transistor 406. The PMOS transistor 406 generates a current (i.e., $I_P$) to the output until the output voltage (i.e., $V_C$) goes up to the lower reference voltage. Furthermore, the lock-in time of the phase-locked loops including the filter connected between $V_C$ and ground is approximately given by $$\frac{(\omega_{in} - \omega_{REFL})^2}{\omega_0^3} + \frac{V_{REFL}C_P}{I_P}$$

where $\omega_{in}$ is the input signal frequency, $\omega_{REFL}$ is the voltage-controlled oscillator's frequency for $V_C = V_{REFL}$, and $\omega_0$ is the loop bandwidth. Also, $V_{REFL}$ is the lower voltage reference and $C_P$ is the value of the capacitor in the filter. The lock-in time is varied by the current $I_P$ depending on the size of the PMOS transistor 406.

In design of the adjustable lock-in circuit of FIG. 4, it is also desirable to use a value for the lower reference voltage, $V_{REFL}$, less than $V'_C$. $V'_C$ is the voltage that makes the frequency of the voltage-controlled oscillator equal to the input signal's frequency. The adjustable lock-in circuit 400 is used for all types of phase-locked loops including the filter connected between $V_C$ and ground.

Since the power-down NMOS transistor 442 is on during power-down mode, it provides an output pull-down path to ground. Thus, $V_C$ of the adjustable lock-in circuit 400 is zero so that no current flows into the circuits during power-down mode.

Figure 5:
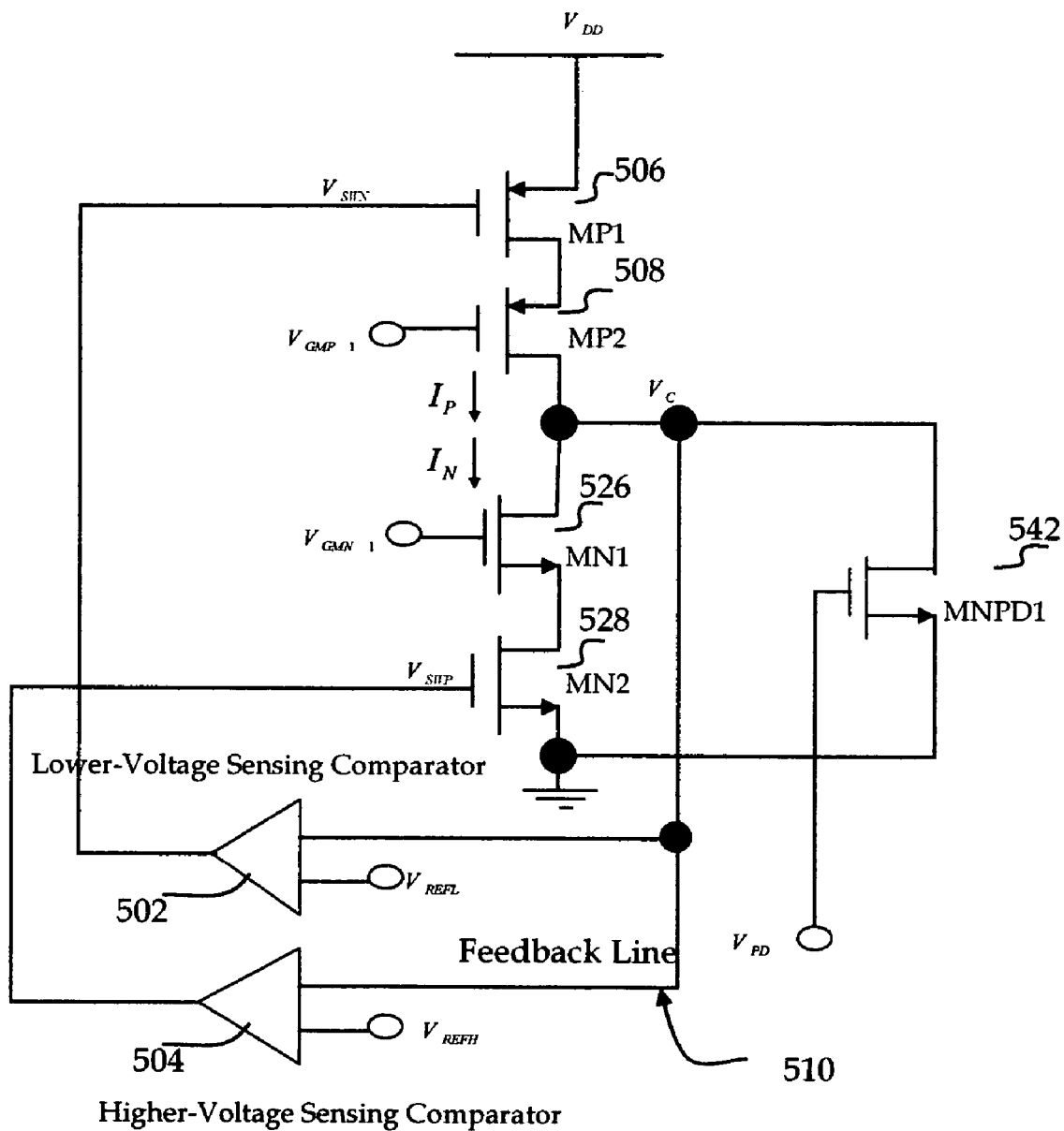
FIG. 5 illustrates a circuit diagram of a dual adjustable lock-in circuit according to the present invention.

FIG. 5 illustrates a dual adjustable lock-in circuit 500 in accordance with the present invention. The dual adjustable lock-in circuit 500 is a modification of the circuit described in FIG. 4. The gate terminal of a PMOS transistor 508 is connected to a proper fixed-bias voltage (not shown) or ground (e.g., "0", low, etc.). The gate terminal of a NMOS transistor 526 is connected to a proper fixed-bias voltage (not shown) or power supply voltage (e.g., $V_{DD}$, "1", high, etc.). Furthermore, compared to FIG. 4, the first difference to note is that the higher-voltage sensing comparator 504 is added into FIG. 5 in order to provide the higher-voltage sensing function. The second difference to note is that the output of the higher-voltage sensing comparator 504 is connected to the gate terminal of a NMOS transistor 528. Therefore, the dual adjustable lock-in circuit 500 is able to sense the lower-voltage as well as the higher-voltage while the adjustable lock-in circuit 400 is able to sense only the lower-voltage.

No current flows into the drains of the NMOS transistors 526 and 528 assuming $V_C < V_{REFH}$ where $V_{REFH}$ is the higher reference voltage for the higher-voltage sensing comparator 504. If $V_C$ is greater than $V_{REFH}$, the gate voltage of the NMOS transistor 528 is $V_{DD}$. As a result, a current flows into the drains of the NMOS transistors 526 and 528 until $V_C$ goes down to $V_{REFH}$.

In design of the dual adjustable lock-in circuit of FIG. 5, it is also desirable to use a value for the lower reference voltage (i.e., $V_{REFL}$) less than $V'_C$ and a value for the higher reference voltage (i.e., $V_{REFH}$) greater than $V'_C$. $V'_C$ is the voltage that makes the frequency of the voltage-controlled oscillator equal to the input signal's frequency. The dual adjustable lock-in circuit 500 is used for all types of phase-locked loops including the filter connected between $V_C$ and ground. Zero dc volt at $V_C$ ensures that no current flows into the circuits during power-down mode.

Figure 6:
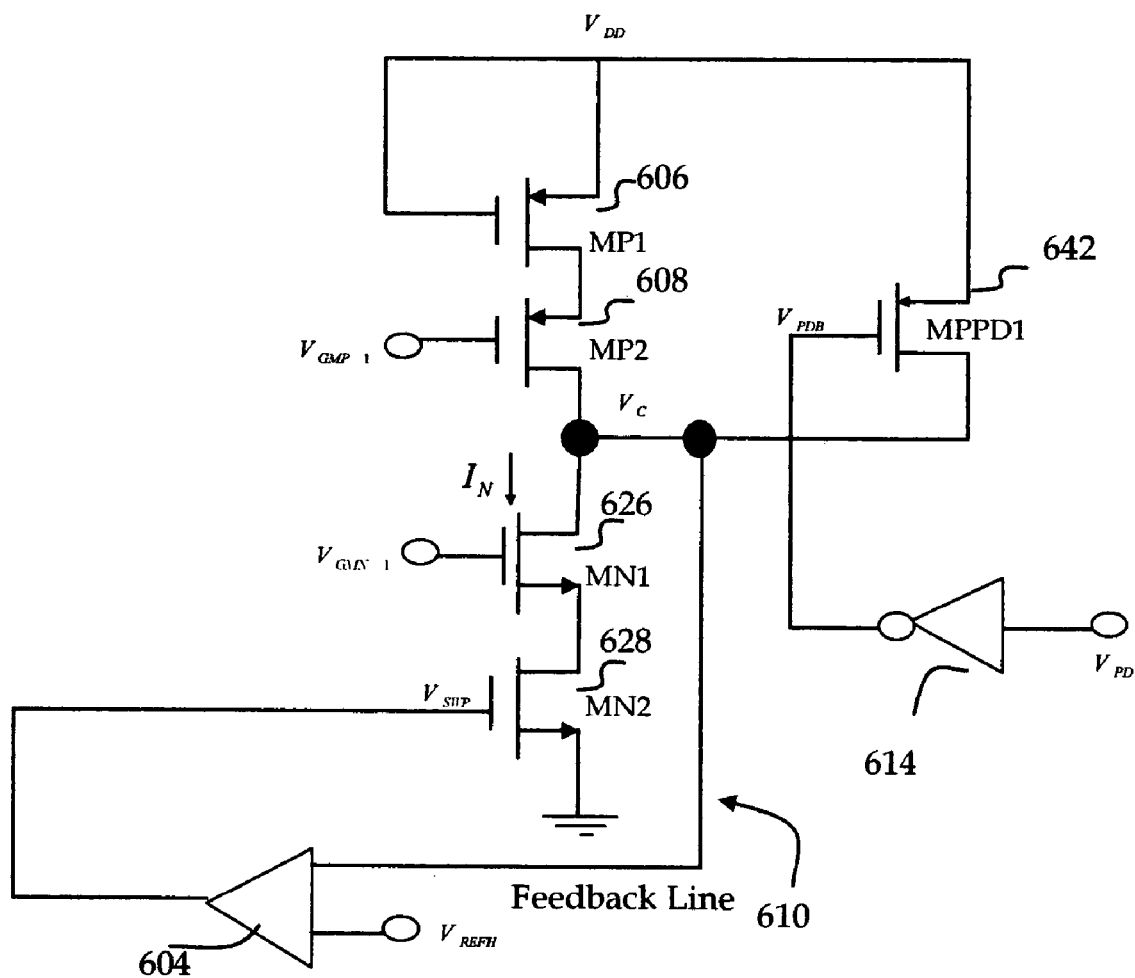
FIG. 6 illustrates a circuit diagram of a p-type adjustable lock-in circuit in accordance with the present invention.

FIG. 6 illustrates a p-type adjustable lock-in circuit 600 according to the present invention. The power-down input voltage, $V_{PD}$, is defined as the input voltage for the p-type power-down mode as well as for the power-down mode. The p-type power-down enable system is in power-down mode when $V_{PD}$ is $V_{DD}$ and it is in normal mode when $V_{PD}$ is zero. The p-type adjustable lock-in circuit 600 is a feedback circuit that consists of a higher-voltage sensing comparator 604, a reference voltage, two stacked PMOS transistors 606 and 608, two stacked NMOS transistors 626 and 628, a feedback line 610, a power-down inverter 614, and a power-down PMOS transistor 642. In addition, the gate terminal of a PMOS transistor 608 is connected to a proper fixed-bias voltage (not shown) or ground (e.g., "0", low, etc.). The gate terminal of a NMOS transistor 626 is connected to a proper fixed-bias voltage (not shown) or power supply voltage (e.g., $V_{DD}$, "1", high, etc.). Furthermore, since the PMOS transistor 606 is turned off, no current flows out of the drains of the PMOS transistors 606 and 608.

The circuit mode changes from p-type power-down mode to normal mode in FIG. 6. Since the higher-voltage sensing comparator 604 initially senses a voltage greater than the higher reference voltage (i.e., $V_{REFH}$), the output voltage of the higher-voltage sensing comparator 604 is high enough to turn on the NMOS transistor 628. The NMOS transistor 628 generates a current (i.e., $I_N$) to the output until the output voltage (i.e., $V_C$) goes down to the higher reference voltage (i.e., $V_{REFH}$). Thus, the lock-in time of the phase-locked loops including the filter connected between $V_C$ and power supply is approximately given by $$\frac{(\omega_{in} - \omega_{REFH})^2}{\omega_0^3} + \frac{(V_{DD} - V_{REFH})C_P}{I_N}$$

where $\omega_{in}$ is the input signal frequency, $\omega_{REFH}$ is the voltage-controlled oscillator's frequency for $V_C = V_{REFH}$, and $\omega_0$ is the loop bandwidth. Also, $C_P$ is the value of the capacitor in the filter and $V_{REFH}$ is the higher reference voltage. The lock-in time is varied by the current $I_N$ depending on the size of the NMOS transistor 628.

In design of the p-type adjustable lock-in circuit of FIG. 6, it is also desirable to use a value for the higher reference voltage (i.e., $V_{REFH}$) greater than $V'_C$. $V'_C$ is the voltage that makes the frequency of the voltage-controlled oscillator equal to the input signal's frequency. The p-type adjustable lock-in circuit 600 is used for all types of phase-locked loops including the filter connected between $V_C$ and power supply.

The output voltage of the power-down inverter 614, $V_{PDB}$, is zero during power-down mode. As a result, the power-down PMOS transistor 642 is turned on and thus provides an output pull-up path to $V_{DD}$. Therefore, $V_C$ of the p-type adjustable lock-in circuit 600 is $V_{DD}$ so that no current flows into the circuits during power-down mode. On the contrary, it was stated earlier that $V_C$ must be zero when power-down mode occurs in FIG. 4 and FIG. 5.

Figure 7:
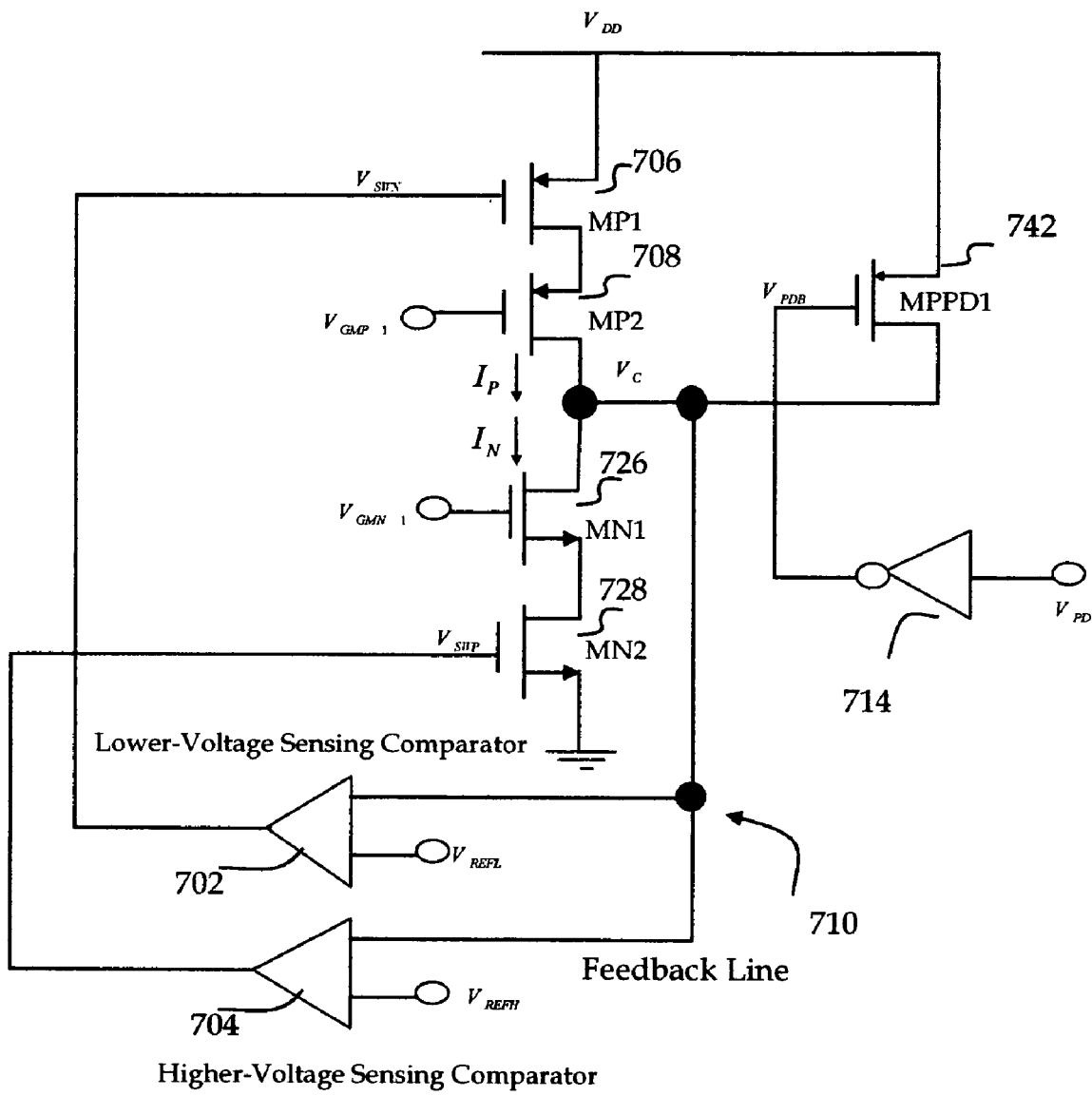
FIG. 7 illustrates a circuit diagram of a p-type dual adjustable lock-in circuit according to the present invention.

FIG. 7 illustrates a p-type dual adjustable lock-in circuit 700 in accordance with the present invention. The p-type dual adjustable lock-in circuit 700 is a modification of the circuit described in FIG. 6. The gate terminal of a PMOS transistor 708 is connected to a proper fixed-bias voltage (not shown) or ground (e.g., "0", low, etc.). The gate terminal of a NMOS transistor 726 is connected to a proper fixed-bias voltage (not shown) or power supply voltage (e.g., $V_{DD}$, "1", high, etc.). Compared to FIG. 6, the first difference to note here is that the lower-voltage sensing comparator 702 is added into FIG. 7 in order to sense the lower-voltage. The second difference to note here is that the output of the lower-voltage sensing comparator 702 is connected to the gate terminal of the PMOS transistor 706. The p-type dual adjustable lock-in circuit 700 is able to sense the lower-voltage as well as the higher voltage while the p-type adjustable lock-in circuit 600 is able to sense only the higher voltage.

No current flows out of the drains of the PMOS transistors 706 and 708 if $V_C$ is greater than the lower reference voltage (i.e., $V_{REFL}$). If $V_C$ is less than $V_{REFL}$, the PMOS transistor 706 is turned on until $V_C$ goes up to $V_{REFL}$.

In design of the p-type dual adjustable lock-in circuit of FIG. 7, it is also desirable to use a value for the higher reference voltage (i.e., $V_{REFH}$) greater than $V'_C$ and a value for the lower reference voltage (i.e., $V_{REFL}$) less than $V'_C$. $V'_C$ is the voltage that makes the frequency of the voltage-controlled oscillator equal to the input signal's frequency. The p-type dual adjustable lock-in circuit 700 is used for all types of phase-locked loops including the filter connected between $V_C$ and power supply. $V_C = V_{DD}$ in the p-type dual adjustable lock-in circuit 700 ensures that no current flows into the circuits during power-down mode.

In summary, the five adjustable lock-in circuits of the present invention simply control how fast the phase-locked loops become locked from an adjustable initial condition. Also, they provide a solution for harmonic locking problem.

Furthermore, three adjustable lock-in circuits 300, 500, and 700 are highly effective for LC oscillator which has a very narrow tuning range. In addition, the initial loop condition is varied by changing the value of reference voltage. The reference voltage is programmable to provide any expected voltage level for different applications. Two approaches for realizing the programmable reference voltages are as follows: 1. The reference voltages are outputs of any digital-to-analog converter whose digital data inputs are programmed. 2. The reference voltages are based on selecting taps of a segmented resistor string by a digital circuit that is coupled to the segmented resistor string. The digital circuit consists of the switch (e.g., multiplexer, transmission-gate, MOS transistor) network that is connected in a tree-like decoder or it consists of a decoder and switches. The digital inputs of the digital circuit are programmed. Furthermore, the CMOS process variations usually must be considered so that the proper value of the reference voltage is chosen for all the adjustable lock-in circuits 300, 400, 500, 600, and 700. Each bulk of two stacked PMOS transistors can be connected to its own N-well to obtain better immunity from substrate noise in all adjustable lock-in circuits. The balance between PMOS output resistance and NMOS output resistance must be considered to obtain high output resistance.

The adjustable lock-in circuit 214 shown in FIG. 2 represents the basic adjustable lock-in circuit 300, the adjustable lock-in circuit 400, and the dual adjustable lock-in circuit 500, as shown in FIG. 3, FIG. 4, and FIG. 5, respectively. Also, the p-type adjustable lock-in circuit 224 shown in FIG. 2 represents the basic adjustable lock-in circuit 300, the p-type adjustable lock-in circuit 600 and the p-type dual adjustable lock-in circuit 700, as shown in FIG. 3, FIG. 6, and FIG. 7, respectively. It is noted that SPICE is used for the simulation of phase-locked loops. The conventional phase-locked loop 110 and the phase-locked loop 210 including the basic adjustable lock-in circuit 300 of the invention are simulated using the same components. As a result, the total simulation time of the conventional phase-locked loop 110 is 20 hours and that of the phase-locked loop 210 is 1.9 hours. This improvement can be accomplished by simply inserting a proper one of the five adjustable lock-in circuits into any conventional phase-locked loop, and the simulation time can be reduced by a factor of 10. So far, it should be noted that the same time step has been used for the SPICE simulation in order to accurately measure and compare the simulation time of all circuits.

All the adjustable lock-in circuits of the present invention are very efficient to implement in system-on-chip (SOC) or integrated circuit (IC). The present invention provides five different embodiments which achieve a drastic improvement in a very fast lock-in time, lock-in time controllability, adjustable initial condition, performance, time-to-market, power consumption, stand-by time, cost, chip area, and design time. While the present invention has been described in particular embodiments, it should be appreciated that the present invention should not be construed as being limited by such embodiments, but rather construed according to the claims below.

What is claimed is:

1. An adjustable lock-in circuit for enabling any phase-locked loop to become locked according to a targeted lock-in time, comprising:
    a feedback line connected with the output of the adjustable lock-in circuit and also coupled to the output of a filter;
    a sensor for comparing a feedback voltage with a reference voltage and providing its output;

two stacked PMOS transistors connected between power supply and the output; and two stacked NMOS transistors connected between the output and ground.

2. The circuit as recited in claim 1 wherein the sensor is a lower-voltage sensing comparator.

3. The circuit as recited in claim 2 wherein the lower-voltage sensing comparator's output is coupled to the gate terminal of the upper PMOS transistor.

4. The circuit as recited in claim 1 wherein the sensor is a high-voltage sensing comparator.

5. The circuit as recited in claim 4 wherein the high-voltage sensing comparator's output is coupled to the gate terminal of the lower NMOS transistor.

6. The circuit as recited in claim 1 wherein the sensors are both a low-voltage sensing comparator and a high-voltage sensing comparator.

7. The circuit as recited in claim 6 wherein the low-voltage sensing comparator's output is coupled to the gate terminal of the upper PMOS transistor and the high-voltage sensing comparator's output is coupled to the gate terminal of the lower NMOS transistor.

8. The circuit as recited in claim 1 wherein the sensor is operational amplifier.

9. The circuit as recited in claim 1 wherein the sensor is an amplifier with a reference voltage.

10. The circuit as recited in claim 1 wherein the sensor is a comparator with a reference voltage.

11. The circuit as recited in claim 1 further comprising a power-down NMOS transistor so that no current flows into the circuit during power-down mode.

12. The circuit as recited in claim 11 wherein the output of the adjustable lock-in circuit is coupled to a filter connected between the output and ground.

13. The circuit as recited in claim 11 wherein the output of the adjustable lock-in circuit is at ground during power-down mode.

14. The circuit as recited in claim 1 further comprising a power-down PMOS transistor and a power-down inverter so that no current flows into the circuit during power-down mode.

15. The circuit as recited in claim 14 wherein the output of the adjustable lock-in circuit is coupled to a filter connected between the output and power supply.

16. The circuit as recited in claim 14 wherein the output of the adjustable lock-in circuit is at power supply during power-down mode.

17. The circuit as recited in claim 1 wherein the reference voltage is output of any digital-to-analog converter whose digital data inputs are programmed.

18. The circuit as recited in claim 1 wherein the reference voltage is based on selecting tap of a segmented resistor string by a digital circuit that is coupled to the segmented resistor string.

19. The circuit as recited in claim 1 wherein the adjustable lock-in circuit is applied to all phase-locked loops without regard to architectures, topologies, and schematics.

* * * * *